United States Patent [19]

Muskovac

[11] Patent Number: 4,482,852
[45] Date of Patent: Nov. 13, 1984

[54] MOTOR SLIP CONTROLLER FOR AC MOTORS

[75] Inventor: Nicholas G. Muskovac, Palm Harbor, Fla.

[73] Assignee: Westinghouse Electric Corp., Pittsburgh, Pa.

[21] Appl. No.: 500,798

[22] Filed: Jun. 7, 1983

Related U.S. Application Data

[63] Continuation of Ser. No. 276,765, Jun. 24, 1981, abandoned.

[51] Int. Cl.³ .................................... H02P 5/40
[52] U.S. Cl. .............................. 318/729; 318/812
[58] Field of Search ............... 318/805, 812, 798, 806, 318/812, 729

[56] References Cited

U.S. PATENT DOCUMENTS

| | | | |
|---|---|---|---|
| 3,345,549 | 10/1967 | Hauser et al. | 318/812 |
| 3,376,485 | 4/1968 | Shibata et al. | 318/812 |
| 3,441,823 | 4/1969 | Schlabach | 318/805 |
| 3,529,223 | 9/1970 | Vergez, Jr. | 318/805 |
| 3,652,924 | 3/1972 | Dieterich et al. | 323/244 |
| 4,057,842 | 11/1977 | Bauman et al. | 361/93 |
| 4,078,393 | 3/1978 | Wills | 318/806 |
| 4,117,408 | 9/1978 | Comstedt | 318/805 |
| 4,190,793 | 2/1980 | Parker et al. | 318/800 |
| 4,260,984 | 4/1981 | Okado | 307/252 T |
| 4,323,835 | 4/1982 | Lee | 318/729 |
| 4,333,046 | 6/1982 | Lee | 318/812 |
| 4,355,274 | 10/1982 | Bourbeau | 318/729 |

FOREIGN PATENT DOCUMENTS 1194587 6/1970 United Kingdom .

OTHER PUBLICATIONS

Rosenberg et al., "Invertor Fed Induction Motor Drive Using Power Factor Control", ISA 76 Annual, pp. 810-813.
"Improved Power-Factor Controller", NASA Tech. Briefs, Summer 1980, vol. 5, No. 2, Marshall Space Flight Center.
Ernst et al., "Current Zero-Crossing Detection for Thyristor Control", IBM Tech. Disc. Bull., vol. 15, No. 3, Aug. 1972, p. 734.
Henry et al., "Motor Tachometer Circuit", IBM Tech. Disc. Bull., vol. 14, No. 7, Dec. 1971, p. 1986.

Primary Examiner—David Smith, Jr.
Attorney, Agent, or Firm—M. J. Moran

[57] ABSTRACT

An energy-saving controller for a multiphase AC induction motor controls the average voltage supplied to the motor windings by the use of a pair of back-to-back SCR's of opposite polarity connected to each winding. The conduction of the SCR's is varied in response to a signal derived from the voltage across each pair of SCR's corresponding to motor slip, the line voltage, and the current flow through each motor winding.

1 Claim, 6 Drawing Figures

MOTOR SLIP CONTROLLER FOR AC MOTORS

This application is a continuation of application Ser. No. 276,765, filed June 24, 1981, now abandoned.

BACKGROUND OF THE INVENTION

1. Field of the Invention

The invention relates to apparatus for controlling AC motors and, more particularly, to an energy-saving controller which varies the average voltage supplied to the motor as the load of the motor varies.

2. Background of the Invention

Conservation of electrical energy is becoming increasingly important in the design and application of AC electric motors. To meet the demand for greater efficiency in the operation of such motors, a variety of increasingly sophisticated control apparatus has become available. For example, U.S. Pat. No. 4,052,648 to Nola and NASA Brief No. MFS-23280 describe a control circuit which reduces power loss in an AC induction motor by sensing the power factor, or phase lag between voltage and current, of the motor. This information is used to vary the average voltage supplied to the motor to maintain a constant optimum power factor in the face of changing loads and line voltages.

Modifications and improvements of the circuit described in the aforementioned U.S. Pat. No. 4,052,648 have resulted in a wider variety of useful applications of the basic power factor control circuit as well as significant increases in the protection of motors controlled by such circuits. For example, copending U.S. patent application Ser. No. 161,327, filed June 20, 1980, by the inventor of the present invention describes an energy saving motor controller applicable to multi-phase motors and capable of a variety of additional features such as in-rush current limiting, over-current trip capability, controlled start-up, and phase loss detection. Such controllers provide very satisfactory service in a variety of applications. However, under certain conditions such as extremely high loads and severe transient loads, motor controllers which operate by sensing changes in the power factor can deliver unsatisfactory performance and may even allow the motor to stall. Furthermore, stability problems are sometimes evident with power factor motor controllers under certain specific load conditions. In order to minimize such stability problems, the response time of most power factor motor controllers is therefore somewhat limited. It would be desirable to provide a controller which would exhibit stable performance over a wider operating range and which would also provide faster response to load transients.

In certain industrial environments, higher than normal line voltage conditions may frequently exist. Operating a motor at such higher voltages can result in higher energy consumption than is necessary to properly drive the load. It would be desirable to provide a motor controller which would reduce the energy consumed by an electric motor under conditions of high line voltage.

Some applications such as in the mining and construction industries can result in overhauling, or regenerative, load conditions. This exists, for example, when a crane is lowering a weight and the load attempts to drive the motor at faster than synchronous speed. Power motor controllers may sometimes operate the motor in an undesirable manner under such conditions. It would therefore be desirable to provide a controller which would allow motor operation to actually take advantage of overhauling loads to save energy by feeding power back into the source.

Finally, although power motor controllers provide generally satisfactory service in many applications, it would be desirable to provide equal or improved performance with simpler apparatus.

SUMMARY OF THE INVENTION

In accordance with the principles of the present invention, apparatus is provided for controlling an AC induction motor. The apparatus includes sensing means for sensing the slip of the motor being controlled and for generating a signal representative of the slip. A reference signal is generated which corresponds to a desired operating condition of the motor. The slip and reference signals are supplied to feedback means connected to the sensing means and to the apparatus generating the reference signal in order to compare the slip signal and the reference signal to produce a feedback control signal which is representative of the difference between the slip signal and the reference signal. This feedback control signal is supplied to control means such as back-to-back parallel SCR's connected in series with the motor and the AC power source. The feedback control signal operates the control means to vary the average voltage supplied to the motor so as to establish the desired operating condition of the motor.

Additional performance advantages are provided by the apparatus, which may further comprise means for sensing the current flow through the motor and for generating a current signal which is supplied to the feedback means to be combined with the slip signal and the reference signal to produce the feedback control signal. A decrease in the slip of the motor or of the current flow through the motor will each be incorporated to provide a feedback control signal which decreases the average voltage supplied to the motor, thereby reducing the energy consumed by the motor under these conditions.

The slip of the motor is determined by measuring the voltage appearing across the control means, rectifying this voltage, and integrating it to provide a DC slip signal.

In a preferred embodiment, the apparatus is employed to control a three-phase AC induction motor, each phase of which includes parallel silicon-controlled rectifiers connected back-to-back with opposite polarities. The voltage across each pair of silicon-controlled rectifiers is integrated, averaged, and combined to provide the slip signal. Furthermore, current transformers are provided for each phase of the motor, the output of each current transformer being rectified and combined to provide a DC current signal. The slip and current signals are then combined with the reference value to produce the feedback control signal which is supplied to drive trigger circuitry connected to the gates of each of the silicon-controlled rectifiers. The gate drive circuitry may be, for example, constructed according to the teachings of the aforementioned U.S. patent application Ser. No. 161,327.

In an alternative embodiment of the present invention, a DC line reference control signal is provided which is proportional to line voltage of the power source. The DC voltage derived from the voltage across the SCR's of each phase of the motor is subtracted from the line reference control signal derived from the AC line voltage, to provide the slip signal.

Apparatus constructed according to the principles of the present invention can provide accurate control of an AC motor without stalling even upon occurrence of severe no-load to full-load transient conditions. At very high loads, such apparatus continues to provide excellent performance. Furthermore, regenerative loads applied to a motor controlled by such apparatus provides proper motor operation while delivering power back into the AC source.

DESCRIPTION OF THE PREFERRED EMBODIMENT

This invention provides an improved energy-saving controller for use on AC induction motors by sensing the slip of the motor and generating a signal corresponding to the value of the motor slip. This slip signal is compared to a reference voltage and the resultant comparison signal used to vary the average voltage supplied to the motor to maintain the motor at a relatively constant slip speed.

Figure 1:
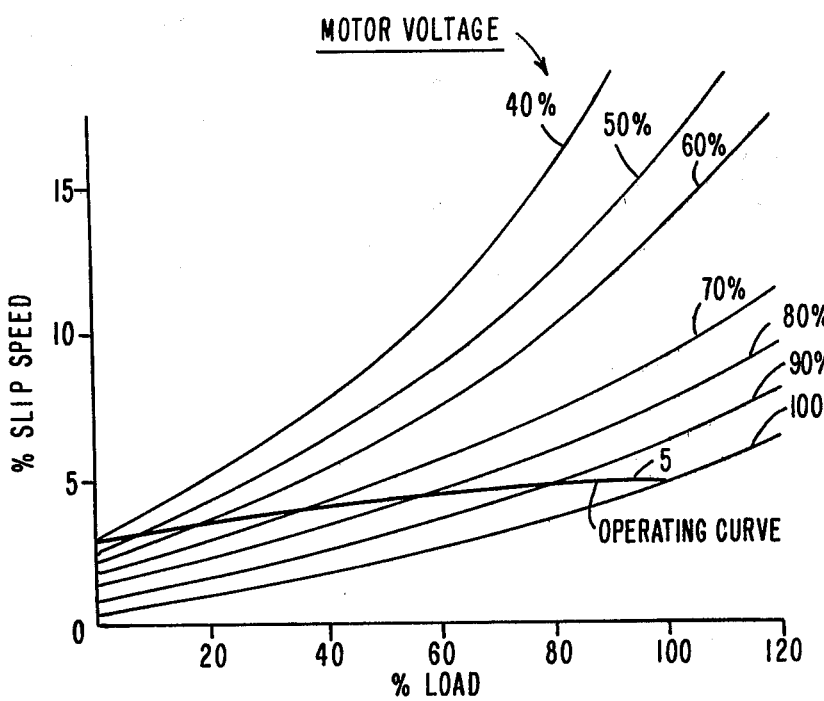
FIG. 1 is a graph presenting a family of curves showing slip speed as a function of motor loading, for a variety of motor voltages.
Figure 2:
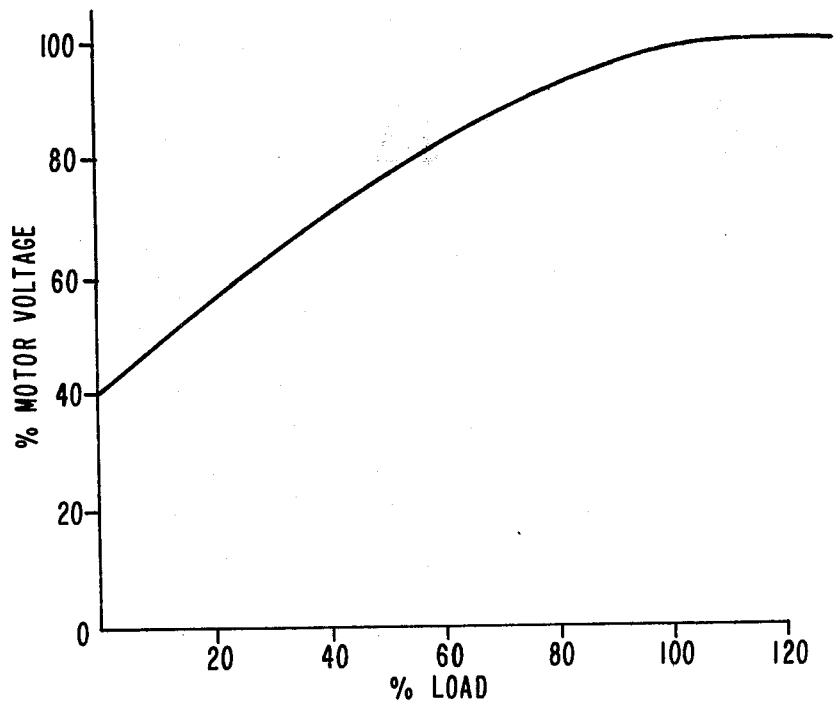
FIG. 2 is a graph showing motor voltage as a function of load for a motor operated by a controller incorporating the principles of the present invention.

FIG. 1 is a graph showing motor slip as a function of motor load and motor voltage. A controller incorporating the principles of the present invention can be used to establish the operating curve 5 shown in FIG. 1, wherein the voltage applied to the motor is varied from 100% motor voltage at 100% load to approximately 40% motor voltage when the motor is in an unloaded condition. As can be seen, the slip of the motor varies only from about 5% to about 3%. The minimum voltage in the unloaded condition is specified by setting a reference voltage, as will be more completely described hereinafter. The variation in motor voltage as a function of motor loading when controlled by apparatus incorporating the present invention is shown in FIG. 2.

Figure 3:
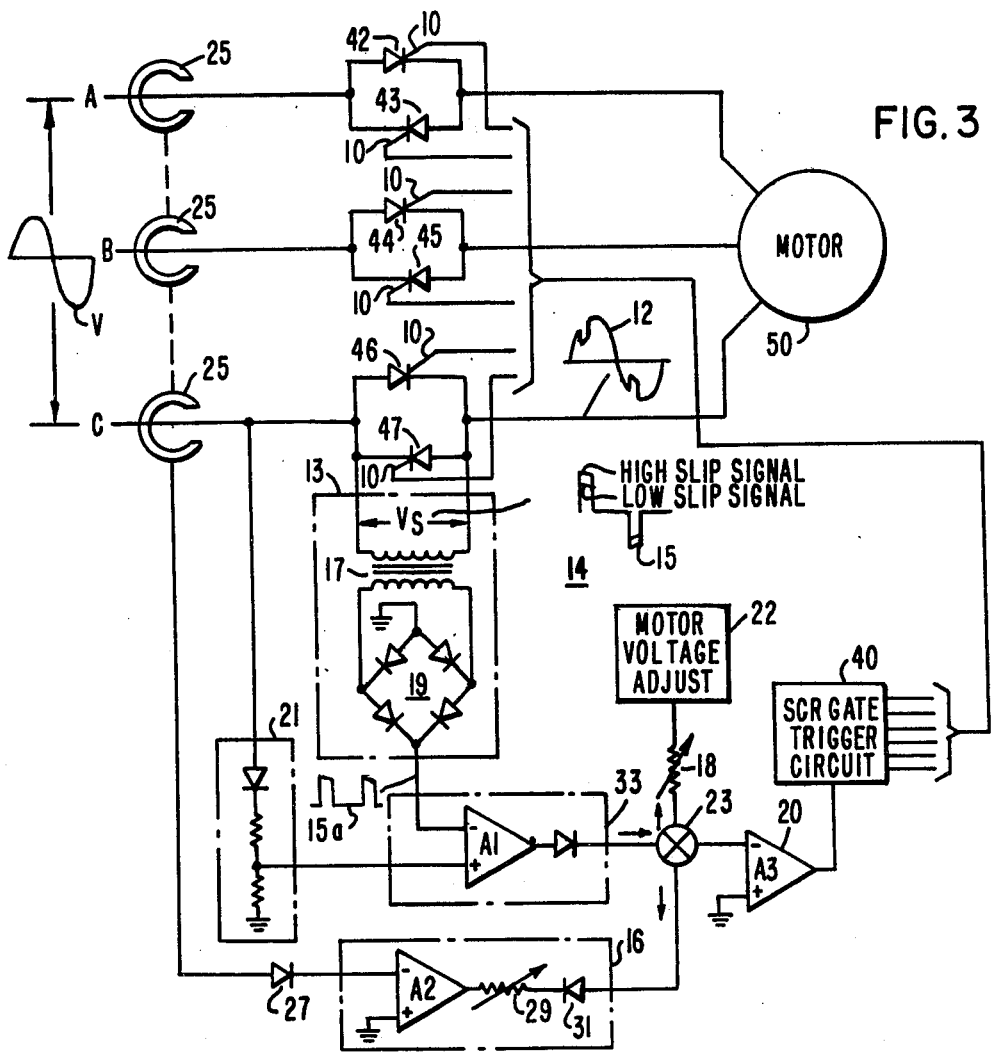
FIG. 3 is a schematic diagram partially in block form of apparatus incorporating the principles of the present invention.

FIG. 3 is a simplified schematic diagram of a three-phase induction motor operated by a motor controller incorporating the principles of the present invention. As can be seen, three phase conductors A, B and C are connected to the appropriate windings of the three-phase induction motor 50. Connected in series with each phase conductor is a pair of parallel silicon-controlled rectifiers (SCR's) 42–47 connected in back-to-back configuration with opposite polarities.

The gate electrodes 10 of each of the SCR's 42–47 are connected to gate trigger circuit 40 which provides gate drive pulses to the SCR's with appropriate timing to vary the average voltage applied to each phase of the motor 50 in a well-known manner. The gate drive circuit 40 is described in greater detail in the aforementioned copending U.S. patent application Ser. No. 161,327.

As is well known in the art, the average voltage supplied to each phase of the motor 50 can be controlled by varying the duty cycle of the SCR's 42–47. To apply full line voltage to each phase of the motor 50, the SCR's are operated by the gate drive circuitry 40 to conduct over the full 360° of the AC waveform. The average voltage may be reduced by correspondingly reducing the duty cycle of the SCR's in a manner so as to allow them to conduct over only a portion of the AC line voltage cycle. The voltage waveform appearing on one phase of the motor 10 is shown in FIG. 3 indicated by the reference character 12. The voltage waveform $V_S$ appearing across the corresponding SCR's 46 and 47 of phase C is indicated at 14 in FIG. 3. This voltage $V_S$ is proportional to the motor slip. As can be seen in the detail 15 of FIG. 3, a high value of slip for the motor 50 causes a correspondingly high value for the voltage $V_S$.

Voltage $V_S$ is applied to a potential transformer 17 where it is reduced to a level appropriate for processing by logic circuitry and is rectified by diode bridge 19 to form a train of DC pulses, as shown at 15a in FIG. 3. These pulses are supplied to the negative input of amplifier A1, the positive input of which may be connected to line reference circuit 21 supplied by the line voltage V. The rectified voltage pulses $V_S$ which constitute an intermediate signal are integrated and subtracted from the line reference signal of the circuit 21 by the amplifier A1. A1 also inverts the resultant signal to provide a proper signal to junction 23. A motor voltage adjust circuit 22 supplies a reference signal through a potentiometer 18 to the junction 23. Optionally, a current feedback signal is also supplied to the junction 23 via current transformers 25 through diode 27, amplifier A2, potentiometer 29, and diode 31. The output of amplifier A2 is adjusted by potentiometer 29 to set the maximum motor voltage which will be supplied under conditions of full motor load. This may not be the same as line voltage, since the motor 50 may be oversized for the application and may run more efficiently at a reduced voltage, thereby saving additional energy.

The voltage supplied by circuit 22 is applied to junction 23 with the same polarity as the motor current signal from amplifier A2. Adjustment of potentiometer 18 sets the minimum motor voltage whenever the motor is substantially unloaded.

The output of feedback amplifier circuit 20 is a positive-going analog DC voltage used as the signal input for the SCR gate trigger circuit 40; the greater this voltage, the more the SCR's 42–47 are turned on, and the higher is the average voltage supplied to the motor 10.

Amplifiers A1 and A2 are also used to filter the feedback voltages so that a low ripple voltage is fed into the feedback amplifier circuit 20 which in turn supplies the SCR gate trigger circuit 40. The filter frequency cut-off and response times are selected to give the desired stability for all operating conditions of the motor 50.

Although the current feedback signal supplied by amplifier A2 is not required in the embodiment of the present invention, even greater stability and operating range of the motor 50 can be obtained with the use thereof.

Figure 4:
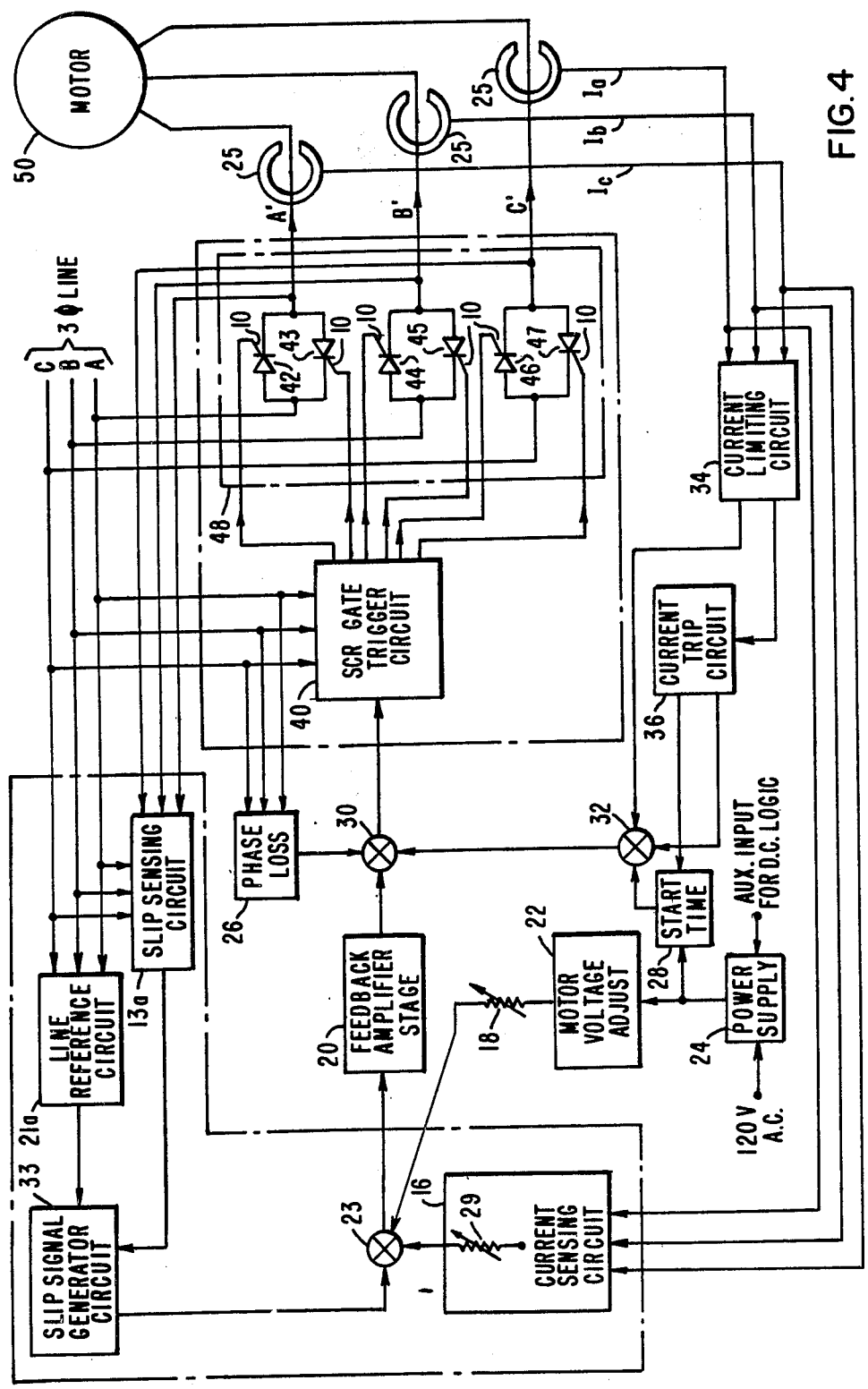
FIG. 4 is a block diagram of a three-phase motor controller incorporating the principles of the present invention.

FIG. 4 is a block diagram of a motor controller employing the principles of the present invention which utilizes three-phase sensing and motor protection circuitry. Three-phase circuits which perform essentially the same function as corresponding single-phase circuits in FIG. 3 are indicated with the addition of an "a" to the reference character.

The three-phase motor 50 shown in FIG. 4 may have either wye or delta-connected windings. Unlike the controller described in NASA Brief No. MFS-23280, the present invention does not require a connection between logic ground and the neutral connection of a wye-connected motor for proper operation. Thus, it is not necessary to bring out the neutral connection of such a motor and tie it to the logic ground or connect both to earth ground. Each phase winding is connected through a pair of parallel back-to-back SCR's of opposite polarity to the appropriate phase of a three-phase power line. The gate electrodes of each of the SCR's 42 through 47 are controlled by the SCR gate trigger circuitry 40, as in FIG. 3. The load side of each pair of SCR's indicated as A', B', and C', respectively, is connected to the slip-sensing circuit 13a. The circuit 13a is also connected to the line side of each pair of SCR's, to thereby sense the voltage $V_S$ across each SCR pair. This three-phase signal is rectified, filtered, and conditioned to provide a DC signal representative of motor slip. The line reference circuit 21a is also connected to the line side of each pair of SCR's. The circuit 21a provides a DC line voltage reference signal to the slip signal generator circuit 33. The slip signal generator circuit 33 subtracts the signal produced by the circuit 13a from the signal produced by the line reference circuit 21a to produce a slip feedback signal which is supplied through junction 23 to the feedback amplifier circuit 20. A motor voltage adjust reference signal produced by the circuit 22 is also supplied to the feedback amplifier stage 20 through the junction 23. A status signal input to the feedback amplifier stage 20 may be provided by combining the slip signal at junction 23 with the output of a three-phase current sensing circuit 16 which is connected to current transformers 25 coupled to the load side connections A', B' and C'. (Current transformers could, of course, also be on the line side.)

The feedback amplifier stage 20 provides a feedback control signal through a junction 30 to the SCR gate trigger circuit 40. The no-load operating voltage of the motor 50 is selected by adjustment of the potentiometer 18 which varies the value of motor voltage adjust reference signal provided by the circuit 22 to the feedback amplifier 20. The maximum motor voltage supplied by the controller during conditions of heavy motor load is selected by adjustment of potentiometer 29 associated with current-sensing circuit 16. Thus, a certain average voltage is supplied to the motor 50 by the SCR's 42-47 during conditions of heavy motor loading. As the motor is unloaded, the slip of the motor 50 and the current drawn thereby will both tend to decrease. The change in slip will manifest itself as a change in the voltage $V_S$ across each pair of SCR's 42-47. This change in voltage will be sensed by the slip-sensing circuit 13a which decreases the voltage supplied to the circuit 33. This causes an increase in the signal supplied by the circuit 33 to the junction 23. Similarly, decreased current flow through the motor windings will be sensed by the current transformers 25. This information is supplied to the current-sensing circuit 16. A greater signal will thus be supplied through the junction 23 to the feedback amplifier circuit 20. This, in turn, generates a larger feedback control signal through the junction 30 to the SCR gate trigger circuit 40. The circuit 40, in response to this change in feedback control signal, produces a pattern of gate pulses to the gates 10 of the SCR's 42-47 to decrease the proportion of AC line voltage over which the SCR's conduct, thereby reducing the average voltage supplied to the windings of the motor 50 to reduce the energy usage of the motor 50 during conditions of light loading.

A number of additional operating and protection features are provided by the controller shown in FIG. 4. For example, during motor start-up, the current drawn by the motor 50 is several times greater than the normal full-load current. Not only does this produce the well-known undesirable effects of momentarily reducing the voltage on the three-phase line supplying the motor, but it can result in substantial increases in energy cost by triggering higher demand charges often imposed by electric utilities. The current-limiting circuit 34 effectively reduces the amount of in-rush current produced by motor starting by producing a cut-back signal to junction 32 which is combined with various other signals to provide an additional input through the junction 30 to the SCR trigger circuitry 40.

The current-limiting circuit 34 is also connected to a current trip circuit 36 which senses the occurrence of severe overload conditions which can damage the windings of the motor 50. Upon detection of such conditions, the circuit 36 generates an instantaneous trip signal through junctions 32 and 30 to cause the SCR gate trigger circuit 40 to immediately deenergize the motor 50. Under less severe overload conditions, the current trip circuit 36 can generate a timed trip signal to a start time circuit 28 which will initiate a similar shutdown of the motor 50, but only after the expiration of a predetermined delay. The start time circuit 28 senses a motor start-up condition and effectively disables the timed trip function of the circuit 36 during conditions of motor start-up when the current drawn by the motor 50 will normally be greater than the standard full load running current. A power supply 24 is provided to produce control power necessary to operate the circuitry of the controller 10.

A phase loss circuit 26 is connected to the line side phase leads A, B and C. Failure of one or more of the phases A, B, C will be detected by the phase loss circuit 26 and a signal applied through junction 30 to the SCR gate trigger circuit 40 to provide instantaneous shutdown of the motor 50.

Various portions of the controller 10 shown in FIG. 4 are described in greater detail in the aforementioned copending U.S. patent application. These portions include the current-limiting circuit 34, the current trip circuit 36, the start time circuit 28, the power supply 24, the phase loss circuit 26, and the SCR gate trigger circuit 40. Accordingly, detailed description of the circuits will not be provided herein.

Figure 5:
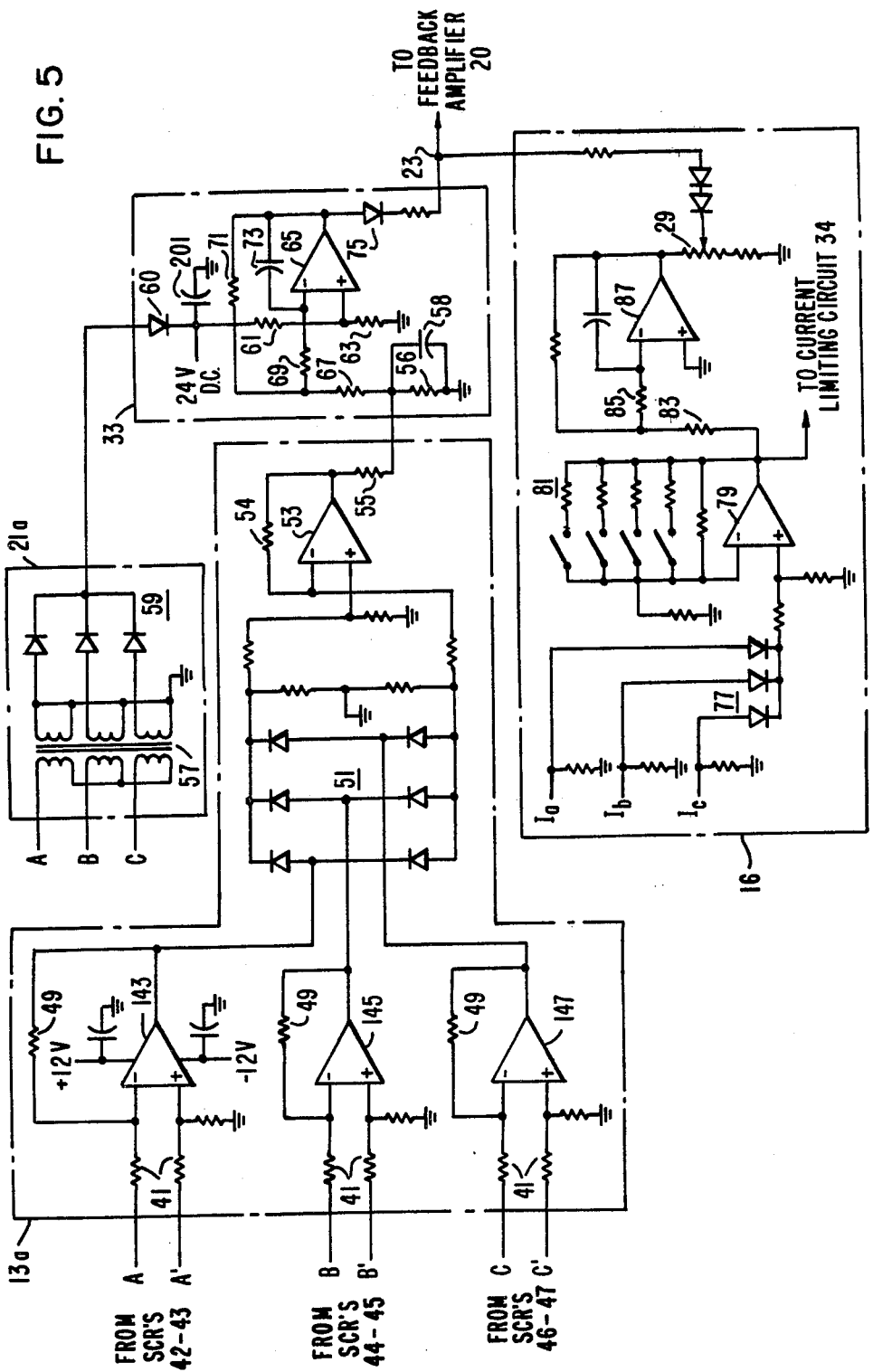
FIG. 5 is an electrical schematic diagram of the slip sensing circuit, the slip signal generator circuit, the voltage reference circuit, and the current signal circuit shown in FIG. 4.

Referring now to FIG. 5, there is shown an electrical schematic diagram of the slip-sensing circuit 13a, the line reference circuit 21a, the slip signal generator circuit 33 and the current-sensing circuit 16. The slip-sensing circuit 13a is connected across each pair of silicon-controlled rectifiers 42-43, 44-45, and 46-47, corresponding to phases A, B, C. The line and load side connections of each phase input are connected through isolating resistors 41 to the negative and positive terminals, respectively, of amplifiers 143, 145, and 147, corresponding to phases A, B and C. Each of the amplifiers 143, 145, 147 and the related circuitry of each, performs the function of transformer 17 of FIG. 3 and provide cost advantages. The positive and negative power supply connections are similar for each of the amplifiers 143, 145, and 147; however, these connections are shown in FIG. 5 for amplifier 143 only. A feedback resistor 49 is connected across each of the amplifiers 143, 145, and 147 to properly set the gains thereof. The output of the amplifiers 143, 145, and 147 are applied to a diode matrix 51 to rectify the voltage pulses produced by the amplifiers 143, 145, and 147 and apply these pulses to amplifier 53. The output of the amplifier 53 is connected through resistor 55 to the slip signal generator circuit 33. The gain of amplifier 53 is set by resistor 54. Capacitor 58 is provided to decrease voltage spikes and provide a cleaner waveform.

A line voltage reference signal is provided by circuit 21a. The line side conductors A, B and C are connected through a transformer 57 to diodes 59 to provide to the input of slip signal generator circuit 33 a pulsating DC voltage proportional to the voltage appearing on the phase conductors A, B and C. This voltage filtered and smoothed by capacitor 201, is applied through diode 60 and a voltage divider consisting of resistors 61 and 63 to the positive input of amplifier 65. Amplifier 65 subtracts the signal provided by the slip sensing circuit 13a from the line voltage reference signal provided by the circuit 21a to produce a slip feedback signal at the output of amplifier 65. The slip feedback signal is filtered and conditioned by resistors 67, 69, 71 and capacitor 73. The slip feedback signal is then supplied through diode 75 to the feedback amplifier 20.

The current-sensing circuit 16 is also shown in FIG. 5. Signals Ia, Ib and Ic from the current transformers 25 are applied to the current-sensing circuit 16, rectified by the diodes 77, and combined and conditioned by the amplifier 79. The bank of resistors 81 is provided to adjust the gain of amplifier 79 to accommodate variations in current transformer tolerance and motor horsepower. Resistors of the bank 81 are switched in to obtain the same voltage at the output of amplifier 79 for different horsepower motors, at 100% load. The output of amplifier 79 is applied through resistors 83 and 85 to the negative input of amplifier 87. Amplifier 87 provides filtering and signal conditioning of the current feedback signal and also reverses the sense of the current feedback signal such that an increase in motor current will result in a current feedback signal to the feedback amplifier circuit 20 which will cause the gate trigger circuit 40 to increase the duty cycle of the SCR's 42 through 47 to increase the average voltage supplied to the windings of the motor 50. Similarly, an increase in the slip of the motor 50 will be detected by the slip-sensing circuit 13a to produce a signal through the slip signal generator circuit 33, the feedback amplifier 20, and the SCR gate trigger circuit 40 to increase the average voltage applied to the motor windings 50.

An increase in line voltage on the phase conductors A, B and C will be detected by the line voltage reference circuit 21a. This will influence the slip signal generator circuit 33 to produce a feedback signal through amplifier 20 to cause the SCR gate circuit 40 to reduce the average voltage applied to the windings of the motor 50. Thus, a condition of high line voltage will not cause a corresponding increase in the average voltage supplied to the motor 50 and the efficiency of the motor will be increased in comparison to operation of the motor 50 by a controller not incorporating the principles of the present invention.

Figure 6:
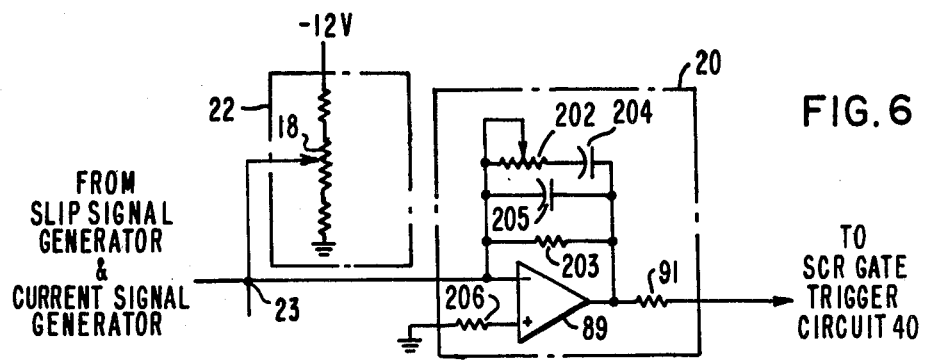
FIG. 6 is an electrical schematic diagram of the feedback amplifier stage shown in FIG. 5.

The current feedback signal from the current-sensing circuit 16 and the slip feedback signal from the slip signal generator current 33 are combined at the junction 23 and supplied to the input of feedback amplifier circuit 20, shown in greater detail in FIG. 6. As can be seen therein, the feedback control signal from the junction 23 is supplied to the negative input of amplifier 89. Also connected to the negative input of the amplifier 89 through the junction 23 is a motor voltage adjust reference signal derived by the circuit 22 from a regulated DC voltage supplied by power supply 24 (FIG. 4). The motor voltage adjust reference signal is adjusted by potentiometer 18 to establish the minimum average voltage to be supplied to the motor 50 during conditions when the motor is unloaded. Resistor 203 sets the gain of amplifier 89, while resistor 202 and capacitor 204 form a load network to compensate the lag produced by the motor time constant. Capacitor 205 forms a low pass filter set for a cutoff frequency of approximately 60 HZ. The positive input of amplifier 89 is tied to logic common through resistor 206.

The output of the amplifier 89 is then supplied through resistor 91 to the input of the SCR gate trigger circuit 40, which is also more completely described in the aforementioned copending U.S. patent application. If the load on the motor 50 is increased, the value supplied to the negative input of amplifier 89 (from the combined slip and current feedback signals and motor voltage reference signal) will drop, resulting in a larger output from amplifier 89 to the trigger circuit 40. This results in increased conduction by the SCR's 42 through 47. The average voltage supplied to the motor will therefore rise accordingly. Similarly, a decrease in the loading of the motor 50 will result in an increased value being supplied to the negative input of amplifier 89, thereby producing a decrease in the value of average voltage supplied to the motor 50.

A motor controller constructed according to the principles of the present invention provides a substantial increase in performing over the prior art. Specifically, satisfactory motor operation without stalling can be provided over a wider variation in motor loading. Response to motor load transients is also faster than with controllers constructed according to the prior art. With low inertial motor loads, the present invention provides a controller which is considerably more stable. Furthermore, a controller constructed according to the principles of the invention provides proper motor operation during regenerative or overhauling load conditions, wherein the load of the motor attempts to drive the motor at greater than synchronous speed. Under these conditions, a motor controlled by apparatus described herein can actually deliver energy into the power source. When an overhauling load is present, the current sensing circuit 16 (FIG. 4) delivers voltage to the amplifier circuit 20 and overcomes the slip feedback signal from the current 33, producing a greater signal from amplifier 20. This causes circuit 40 to turn on the SCRS 42–49 and allow them to conduct current back into the line. The greater the overhauling force the more the SCRS will turn on until they are on full, allowing substantially all the energy and current to go back into the line.

Finally, greater energy savings are possible than were obtained with prior art controllers since the motor can be run at lower voltages in an unloaded condition and can also reduce the energy consumed by a fullyloaded motor operated under conditions of high line voltage. It can be seen therefore that the present invention provides a motor controller exhibiting significant advantages over the prior art.

I claim:

1. Energy saving control apparatus for a constant-frequency AC induction motor, comprising:

control means comprising an electronic switch having a control terminal and a pair of output terminals connected in series circuit relationship with a motor being controlled thereby and a source of AC power;

sensing means interconnected with both of said output terminals for generating a sense signal proportional to the amplitude of the voltage across said control means; and feedback means responsive solely to the amplitude of current and voltage levels in said apparatus, said feedback means being interconnected with said sensing means to receive said sense signal therefrom, said feedback means being interconnected with said control means at said control terminal thereof, said feedback means comprising a line voltage reference means for generating a line voltage signal proportional to the amplitude of the voltage of the AC power and for subtracting said sense signal from said line voltage reference signal to produce a feedback control signal for being applied to said control terminal, said feedback means also comprising current means for generating a current signal proportional to the amplitude of current flow through the motor being controlled, said feedback means incorporating said current signal into said feedback control signal such that an increase in the amplitude of said current flow causes an increase in the conduction time of said electronic switch of said control means, said control means utilizing said feedback control signal to vary the average voltage supplied to said motor as a function of the voltage across said control means and the current through said motor.

* * * * *